(12) United States Patent
Yeo et al.

(10) Patent No.: US 6,979,867 B2
(45) Date of Patent: Dec. 27, 2005

(54) SOI CHIP WITH MESA ISOLATION AND RECESS RESISTANT REGIONS

(75) Inventors: Yee-Chia Yeo, Hsin-Chu (TW);
Hao-Yu Chen, Kaohsiung (TW);
Hsun-Chih Tsao, Hsin-Chu (TW);
Fu-Liang Yang, Hsin-Chu (TW);
Chenming Hu, Hsin-Chu (TW)

(73) Assignee: Taiwan Semiconductor Manufacturing Ltd. Co., Hsin-Chu (TW)

( * ) Notice: Subject to any disclaimer, the term of this patent is extended or adjusted under 35 U.S.C. 154(b) by 0 days.

(21) Appl. No.: 11/022,730

(22) Filed: Dec. 27, 2004

(65) Prior Publication Data

US 2005/0101111 A1   May 12, 2005

Related U.S. Application Data

(62) Division of application No. 10/435,286, filed on May 9, 2003, now Pat. No. 6,864,149.

(51) Int. Cl.[7] .............................................. H01L 23/58
(52) U.S. Cl. .................................................... 257/353
(58) Field of Search ....................................... 257/353

(56) References Cited

U.S. PATENT DOCUMENTS

| | | |
|---|---|---|
| 4,072,974 A | 2/1978 | Ipri |
| 5,013,681 A | 5/1991 | Godbey et al. |
| 5,024,723 A | 6/1991 | Goesele et al. |
| 5,213,986 A | 5/1993 | Pinker et al. |
| 5,374,564 A | 12/1994 | Bruel |
| 5,468,657 A | 11/1995 | Hsu |
| 5,633,588 A | 5/1997 | Hommei et al. |
| 5,659,192 A | 8/1997 | Sarma et al. |
| 5,663,588 A | 9/1997 | Suzuki et al. |
| 5,739,574 A | 4/1998 | Nakamura |
| 5,759,898 A | 6/1998 | Ek et al. |
| 5,769,991 A | 6/1998 | Miyazawa et al. |
| 5,863,830 A | 1/1999 | Bruel et al. |
| 5,882,981 A | 3/1999 | Rajgopal et al. |
| 5,904,539 A | 5/1999 | Hause et al. |
| 6,143,070 A | 11/2000 | Bliss et al. |
| 6,159,824 A | 12/2000 | Henley et al. |
| 6,291,321 B1 | 9/2001 | Fitzgerald |
| 6,335,231 B1 | 1/2002 | Yamazaki et al. |
| 6,355,541 B1 | 3/2002 | Holland et al. |
| 6,358,806 B1 | 3/2002 | Puchner |
| 6,368,938 B1 | 4/2002 | Usenko |
| 6,407,406 B1 | 6/2002 | Tezuka |
| 6,410,371 B1 | 6/2002 | Yu et al. |
| 6,410,938 B1 | 6/2002 | Xiang |
| 6,429,061 B1 | 8/2002 | Rim |
| 6,486,008 B1 | 11/2002 | Lee |
| 6,750,097 B2 | 6/2004 | Divakaruni et al. |
| 2002/0140031 A1 | 10/2002 | Rim |

OTHER PUBLICATIONS

Current, M.I., et al., "Atomic-Layer Cleaving and Non-Contact Thinning and Thickening for Fabrication of Laminated Electronic and Photonic Materials," 2001 Materials Research Society Spring Meeting (Apr. 16-20, 2001).

(Continued)

*Primary Examiner*—David S. Blum
(74) *Attorney, Agent, or Firm*—Slater & Matsil, L.L.P.

(57) ABSTRACT

A semiconductor-on-insulator structure includes a substrate and a buried insulator layer overlying the substrate. A plurality of semiconductor islands overlie the buried insulator layer. The semiconductor islands are isolated from one another by trenches. A plurality of recess resistant regions overlie the buried insulator layer at a lower surface of the trenches.

20 Claims, 6 Drawing Sheets

OTHER PUBLICATIONS

Current, M.I., et al., "Atomic-layer Cleaving with $Si_x Ge_y$ Strain Layers for Fabrication of Si and Ge-rich SOI Device Layers," 2001 IEEE SOI Conference (Oct. 1-4, 2001) pp. 11-12.

Langdo, T.A., et al., "Preparation of Novel SiGe-Free Strained Si on Insulator Substrates," 2002 International SOI Conference (Aug. 2002) pp. 211-212.

Mizuno, T., et al., "Novel SOI p-Channel MOSFETs With Higher Strain in Si Channel Using Double SiGe Heterostructures," IEEE Transactions on Electron Devices, vol. 49, No. 1 (Jan. 2002) pp. 7-14.

Rim, K., et al., "Fabrication and Analysis of Deep Submicron Strained-Si N-MOSFETs," IEEE Transactions on Electron Devices, vol. 47, No. 7 (Jul. 2000) pp. 1406-1415.

US 6,979,867 B2

SOI CHIP WITH MESA ISOLATION AND RECESS RESISTANT REGIONS

This application is a divisional of patent application Ser. No. 10/435,286, entitled "SOI Chip with Mesa Isolation and Recess Resistant Regions," filed on May 9, 2003, and now U.S. Pat. No. 6,864,149 B2, which application is incorporated herein by reference.

CROSS-REFERENCE TO RELATED APPLICATIONS

This application relates to the following co-pending and commonly assigned patent applications: Ser. No. 10/379,873, entitled "Method of Forming Strained Silicon on Insulator Substrate," filed Mar. 5, 2003; and Ser. No. 10/384,859, entitled "SOI Chip with Recess-Resistant Buried Insulator and Method of Manufacturing the Same," filed Mar. 10, 2003, which applications are hereby incorporated herein by reference.

TECHNICAL FIELD

The present invention relates generally to silicon-on-insulator devices, and more particularly, the preferred embodiment of the present invention relates to silicon-on-insulator devices isolated by mesa isolation where recess-resistant regions are incorporated in the insulator region.

BACKGROUND

Traditional silicon-on-insulator (SOI) integrated circuits are formed on SOI substrates. A cross-section of a silicon-on-insulator (SOI) substrate 10 is illustrated in FIG. 1a. SOI substrates typically have a thin layer of silicon 12, also known as the silicon active layer, disposed on an insulator layer 14 such as the buried oxide (BOX) layer. The insulator layer or the buried oxide layer 14 is provided on a silicon substrate 16. The buried oxide layer 14 is comprised of an insulator such as silicon oxide. It electrically isolates the silicon active layer 12 from the silicon substrate 16.

In a conventional SOI chip, as shown in FIG. 1b, the SOI substrate 10 is processed to form a plurality of active regions 18 in the active layer 12. Active devices 20 such as transistors and diodes may be formed in the active regions 18. Active regions 18 are electrically isolated from each other by isolation regions 22. The size and placement of the active regions 18 are defined by isolation regions 22. Isolation regions 22 may, for example, be formed of shallow trench isolation (STI). Moreover, the active devices 20 are isolated from the substrate 16 by the buried oxide layer 14.

State of the art shallow trench isolation structures typically have a groove-like recess 32 at the isolation edge, as shown in FIG. 1b. This groove-like recess 32 results from commonly used wet-etch processes and the recess is in the range of tens to a two hundred angstroms below the surface of the active layer. When the thickness of the active layer is about one hundred angstroms, the groove-like recess potentially encroaches into the buried oxide and therefore renders the STI ineffective in protecting the buried oxide from being etched during wet cleaning processes. Moreover, the top surface of the isolation may also be recessed. In cases where the shallow trench isolation is exposed to an excessive amount of wet-etch processes, the STI may be entirely etched, resulting in an exposed buried oxide between active regions.

Active devices formed on SOI substrates offer many advantages over their bulk counterparts, including absence of reverse body effect, absence of latch-up, soft-error immunity, and elimination of junction capacitance typically encountered in bulk silicon devices. SOI technology therefore enables higher speed performance, higher packing density, and reduced power consumption. At present, commercial products using SOI technology employ an uniform active layer thickness and shallow trench isolation.

One type of SOI transistor employs a very thin silicon active layer. For example, the silicon active layer thickness can be as thin as a third of the gate length. If the gate length is 30 nm, the silicon active layer may have a thickness of 10 nm or thinner. This type of SOI transistor is known as ultra-thin body (UTB) transistors or depleted-substrate transistors (DSTs).

When the thickness of the silicon active layer is as thin as 10 nm, mesa isolation could be a more appropriate isolation scheme for the transistors as compared to shallow trench isolation. In mesa isolation, trenches 24 are formed in the active layer 12, as shown in FIG. 2a. The trenches 24 extend from the surface of the active layer 12 to the buried oxide layer 14. These trenches divide the active layer into silicon islands or silicon mesa structures 26. The mesa isolation method thus cuts electrical connection between adjacent active regions by removing portions of the active layer in the SOI substrate.

One major problem of the mesa isolation is that the exposed buried oxide layer surface 28 will be recessed in subsequent chemical treatments such as wafer cleaning steps. This issue is illustrated in FIG. 2b. The recessed buried oxide results in a number of problems. For example, it leads to an increased parasitic capacitance between the substrate and metal lines running over the buried oxide. It also leads to a concentration of electric field lines around the exposed corners 30 of the silicon mesas 26, which potentially impact device reliability.

In U.S. Pat. No. 5,904,539 issued to Hause et al., a trench isolation process is described for improving the overall planarity of filled isolation regions relative to adjacent silicon mesas. This approach is similar to shallow trench isolation.

In U.S. Pat. No. 6,410,938 issued to Xiang, semiconductor-on-insulator devices isolated by a nitrided buried oxide are described for the reduction of dopant penetration from the active layer into the buried oxide. The nitrided buried oxide is formed by an implantation of nitrogen or nitrogen-containing species through the semiconductor active layer to reach the buried silicon oxide.

In U.S. Pat. No. 5,468,657 issued to Hsu, a method is provided for improving the electrical isolation in SIMOX buried oxide wafers. In that invention, nitrogen ions are implanted into a wafer to approximately the same depth as oxygen ions are implanted during SIMOX processing. A subsequent heating step causes the nitrogen ions to migrate to the interface region between the buried oxide and the upper and lower semiconductor regions of the substrate. The nitrogen passivates the interface region to reduce the presence of buried free electrons trapped in the substrate.

SUMMARY OF THE INVENTION

In one aspect, the present invention provides a silicon-on-insulator chip with a recess-resistant insulator in the isolation regions between silicon mesas. In another aspect, this invention provides a buried insulator with a recess-resistant layer that has negligible etch rates in commonly used wet cleaning solutions. In yet another aspect, this invention provides a silicon nitride recess-resistant layer in the buried oxide of a silicon-on-insulator substrate.

In one embodiment, a recess-resistant semiconductor-on-insulator structure includes a substrate and an insulator layer overlying the substrate. Semiconductor islands overlie portions of the buried insulator layer. Recess-resistant regions are disposed in portions of the insulator layer not covered by the semiconductor islands.

A method of forming a recess-resistant semiconductor-on-insulator substrate is also described. For example, a semiconductor structure includes semiconductor islands overlying portions of an insulator layer. Recess-resistant regions are formed in portions of the insulator layer not covered by the semiconductor islands. Devices, such as transistors and/or diodes, can then be formed on the semiconductor islands.

According to embodiments of the present invention, a recess-resistant layer is provided in the buried insulator of a semiconductor-on-insulator wafer for the purpose of restricting the amount of recess in the exposed insulator during wafer processing such as wet cleaning of wafers in dilute hydrofluoric acid. This can be important where the mesa isolation scheme is adopted in the fabrication of a semiconductor-on-insulator integrated circuit chip. Semiconductor-on-insulator integrated circuit chips employing the mesa isolation scheme have exposed buried insulator surfaces. The exposed buried insulator surfaces are susceptible to chemical attack or etching during wafer processing. This invention teaches a structure and method of forming a recess-resistant region in the insulator in regions that are susceptible to chemical attack or etching.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a silicon-on-insulator (SOI) semiconductor device. Two embodiment structures will first be described with respect to FIGS. 3a–3b and 4a–4b. Two methods will then be described with respect to FIGS. 5a–5h and a third method will be described with respect to FIGS. 6a–6h.

Figure 1A:
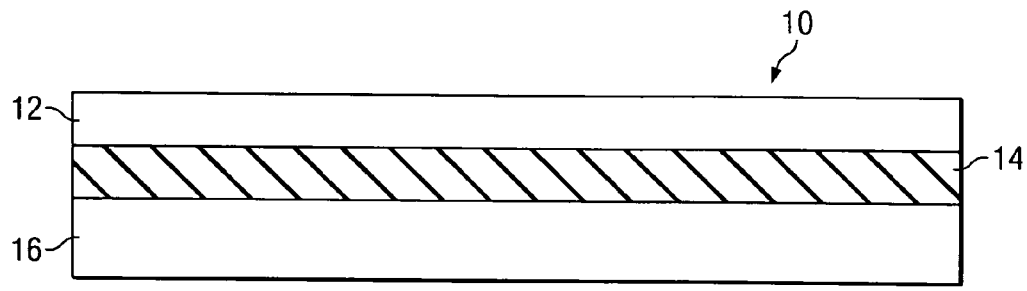
FIG. 1a illustrates a convention SOI substrate.
Figure 1B:
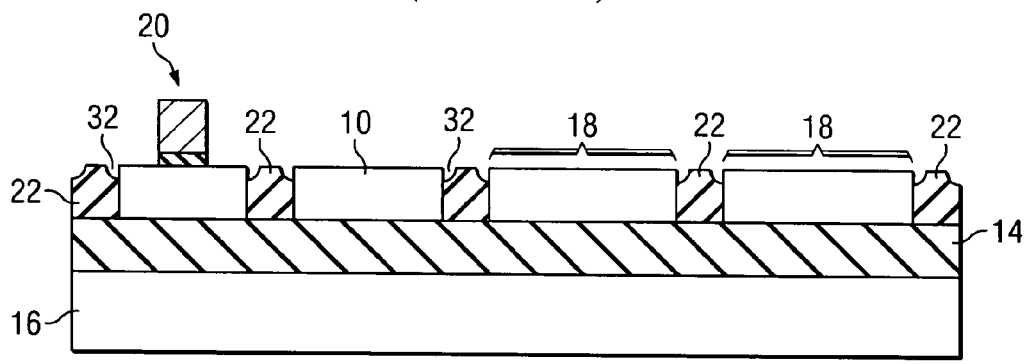
FIG. 1b illustrates a convention SOI device.
Figure 2A:
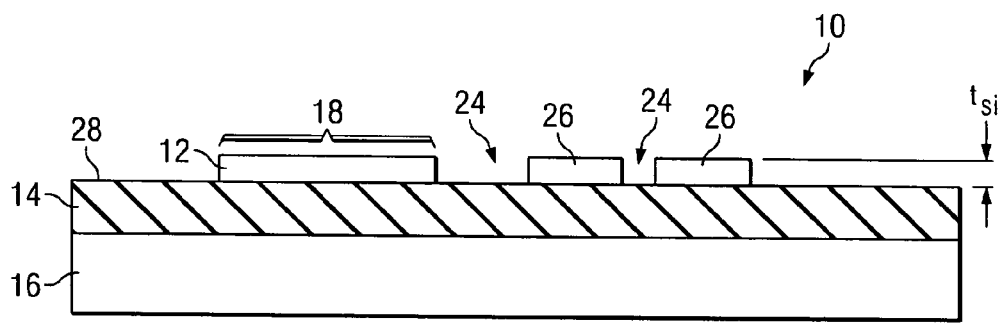
FIG. 2a illustrates a convention SOI device with silicon islands in an active layer.
Figure 2B:
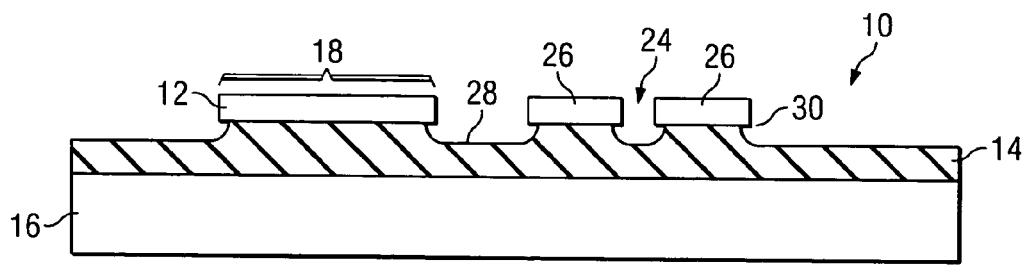
FIG. 2b illustrates recesses in the buried oxide of a convention SOI device.
Figure 3A:
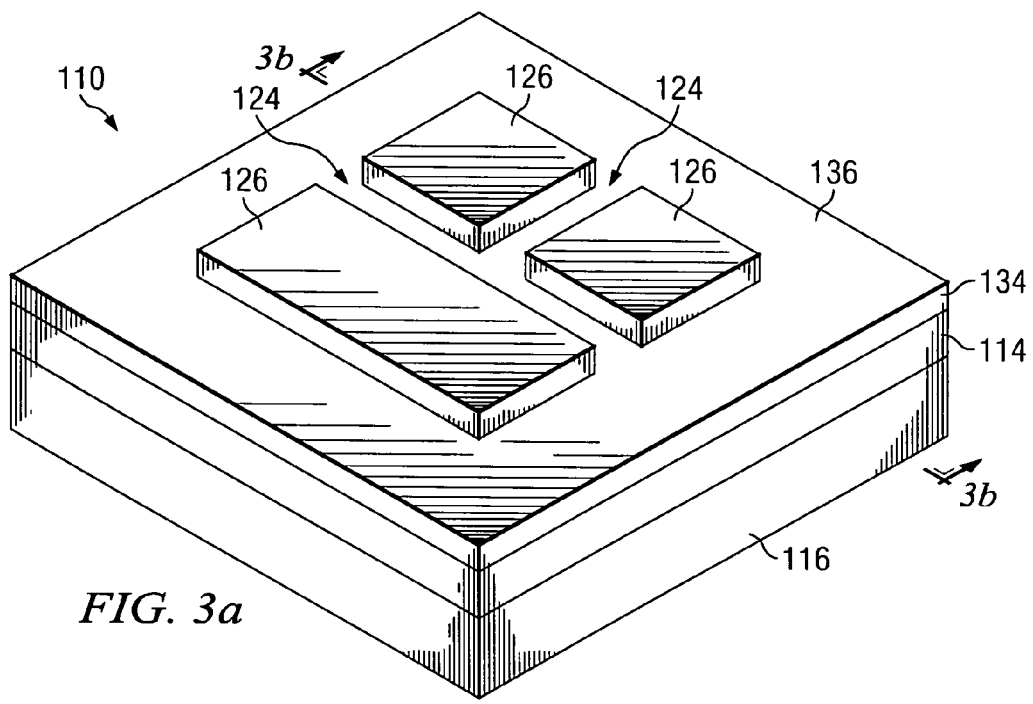
FIGS. 3a and 3b show a first embodiment structure of the present invention.
Figure 3B:
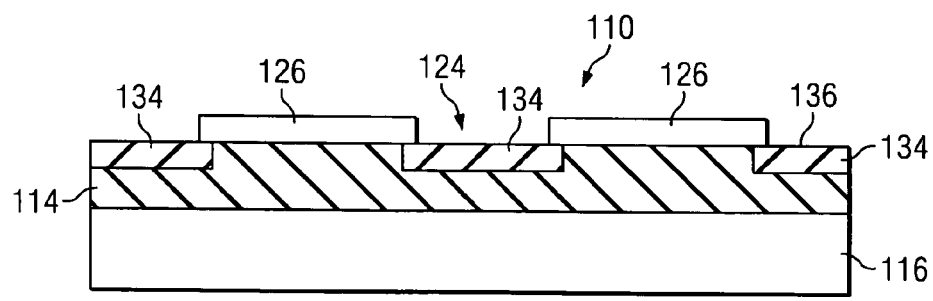

FIGS. 3a and 3b will now be used to illustrate a first embodiment of the present invention. As shown in FIG. 3a, an SOI chip 110 includes semiconductor mesas or islands 126 that are isolated from the substrate 116 by a buried insulator 114. The substrate 116 is preferably a silicon substrate. For example, an undoped or lightly doped monocrystalline silicon substrate can be utilized.

According to the present invention, a portion of the buried insulator 114 includes a recess-resistant region 134 that is resistant to commonly used wafer wet cleaning solutions. That is, the etch rate of the recess-resistant region 134 is extremely slow in commonly used wafer wet cleaning solutions so that the total amount etched is negligible. The thickness of the recess-resistant region 134 may range from about 2 angstroms to about 200 angstroms, and is more preferably less than 100 angstroms (e.g., from about 10 angstroms to about 100 angstroms). The recess-resistant region 134 is formed on the buried insulator layer 114.

The buried insulator layer 114 can be a dielectric material such as silicon oxide, for example, and may have a thickness ranging from about 100 angstroms to about 5000 angstroms. One commonly used wet cleaning solution is dilute hydrofluoric acid. Dilute hydrofluoric acid may, for example, be formed by a mixture of 1 part of concentrated (49%) hydrofluoric (HF) acid and 25 parts of water ($H_2O$). This mixture is also commonly known as 25:1 HF. Another commonly used wafer cleaning solution is a mixture of concentrated sulphuric acid and hydrogen peroxide, commonly known as piranha solution.

The recess-resistant region 134 is preferably comprised of a dielectric material that has very slow or negligible etch rates in commonly used wet cleaning solutions such as the above-mentioned chemicals or solutions. As shown in FIGS. 3a and 3b, the buried insulator surface 136 is exposed to common wet cleaning etchants in regions not covered by the semiconductor mesas 126 when the mesas are formed. The recess-resistant layer 134 therefore minimizes the reduction in the physical thickness of the buried insulator. It also prevents the formation of a significant recess in the exposed portion of the buried insulator stack.

In the preferred embodiment, the recess-resistant region 134 is formed from silicon oxynitride (e.g., $SiO_xN_y$). The etch rate of silicon oxynitride in 25:1 HF is about 1 to 6 angstroms per minute. The etch rate of thermally grown silicon oxide in 25:1 HF is more than ten times higher, about 100 angstroms per minute. By using silicon oxynitride as a recess-resistant region on the exposed surface of the buried insulator, as illustrated in FIGS. 3a and 3b, the recess in the buried insulator can be reduced by more than ten times. Selection of other materials could lead to different differences in etch rates.

Figure 4A:
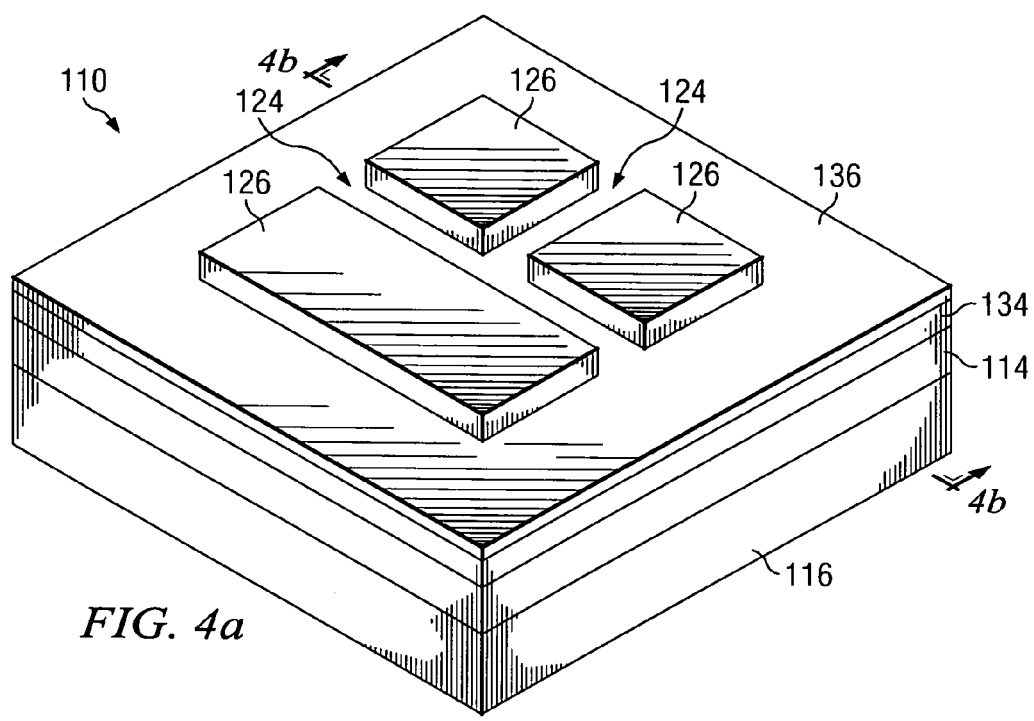
FIGS. 4a and 4b show a second embodiment structure of the present invention.
Figure 4B:
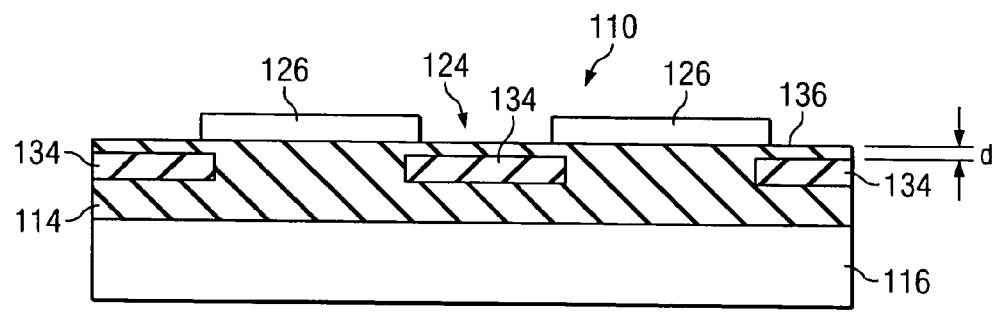

In another embodiment of the present invention, the recess-resistant region 134 does not need to be the topmost layer of the buried insulator stack 114. Referring now to FIGS. 4a and 4b, the recess-resistant region 134 may be formed at a depth d beneath the exposed surface 136 of the buried insulator. The buried insulator 114 is preferably comprised of silicon oxide, but may be any other dielectric such as aluminum oxide. The depth d is preferably less than about 200 angstroms. The depth d is preferably kept very thin to limit the amount of recess in the buried insulator. The depth d may be measured from the surface 136 to the peak of the nitrogen content or nitrogen profile in the silicon oxynitride region 134.

The recess-resistant region 134 in this embodiment is preferably silicon oxynitride. The thickness of the recess-resistant region may range from about 2 angstroms to about 200 angstroms, and is more preferably less than about 100 angstroms (e.g., from about 10 angstroms to about 100 angstroms). The recess-resistant regions 134 are located in regions susceptible to chemical attack or etching, such as the regions shown in FIG. 4b. The material comprising the buried insulator 114, e.g., silicon oxide, is in direct contact with the semiconductor islands 126, e.g., silicon, and serves the purpose of providing a high quality interface between the buried insulator 114 and the semiconductor islands 126.

The interface between silicon oxide and silicon has a much better lower interface state density than the interface between silicon oxynitride and silicon. Good interface properties and low bulk trap density can be important for the achievement of good electrical characteristics in the active devices. This is especially important in active devices with ultra-thin body thicknesses, in which case the mobile carriers flowing between the source and drain (not shown in FIG. 4b; see FIG. 5h) are in close proximity to the interface between the active layer 126 and the buried insulator 114. For example, trapped charges or charge centers near the top of the buried insulator may degrade the carrier mobility in the channel region of an ultra-thin body transistor by Coulombic scattering. The low bulk trap density and a low interface trap density ensure that mobility degradation due to Coulombic scattering is kept to a minimum.

In the following description, methods of forming the above-mentioned structure will be detailed. A first embodiment method will be discussed with respect to FIGS. 5a–5h. An alternate embodiment method will then be described.

Figure 5A:
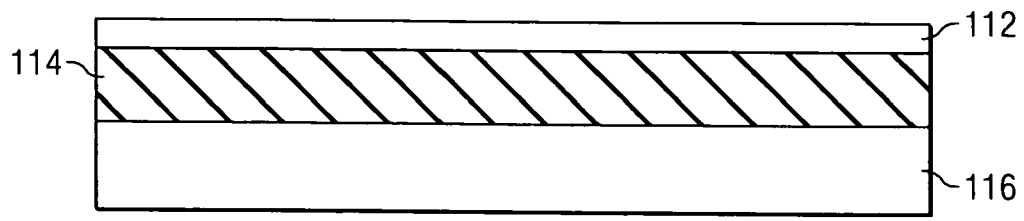
FIGS. 5a–5h show a method to form an SOI device of the present invention.

Referring now to FIGS. 5a–5h, cross-sections of the wafer during the various steps of the fabrication process flow are shown. In FIG. 5a, the starting substrate includes a semiconductor active layer 112 overlying a buried insulator layer 114. The semiconductor layer 112 is preferably a silicon layer and the buried insulator layer 114 is preferably silicon oxide (e.g., $SiO_2$). The silicon layer may, for example, be a thin layer of epitaxially grown monocrystalline silicon. However, it is understood that the semiconductor layer 114 may be comprised of other materials such as silicon germanium, germanium, or gallium arsenide, as just three examples. It is also understood that the semiconductor layer 114 may be strained, e.g. strained silicon. The strained silicon may be silicon with a tensile strain, and more specifically silicon with a biaxial tensile strain. The strained silicon may alternatively be silicon with a compressive strain, and more specifically silicon with a biaxial compressive strain.

Figure 5B:
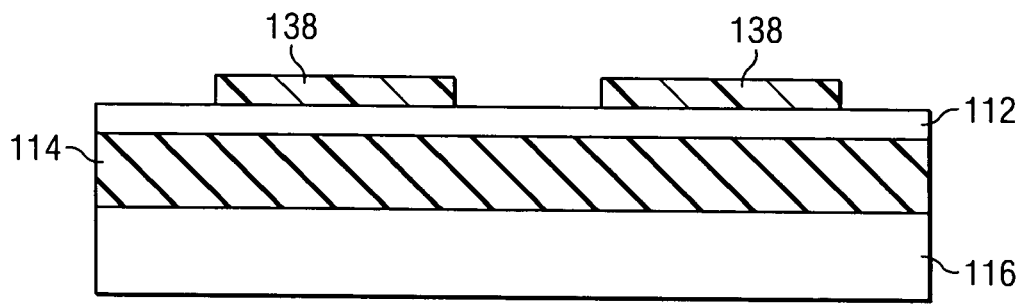

As shown in FIG. 5b, a mask 138 is used to define active regions or islands 126 in the active layer 112. The mask 138 may be any masking material known and used in the art, such as silicon oxide, silicon nitride, or silicon oxynitride. The mask 138 may also be formed of a stack, e.g., including a silicon nitride layer overlying a silicon oxide layer.

Figure 5C:
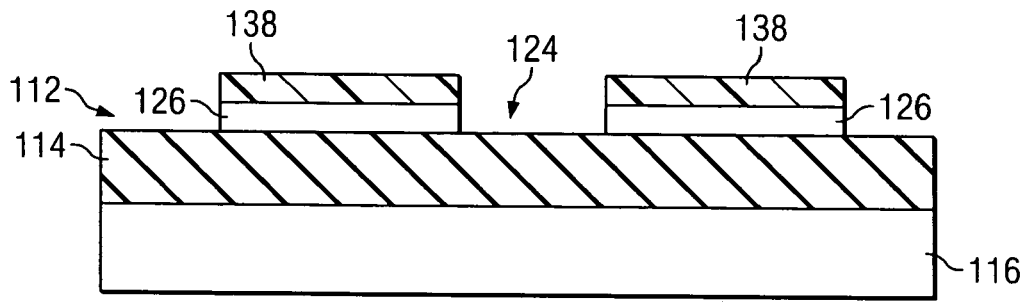

Following active region definition using mask 138, the active layer 110 is etched using techniques known and used in the art. If the active layer is comprised of silicon, a dry plasma etch using fluorine chemistry may be used. The etching of the active layer 110 forms trenches 124 between silicon islands 126, as shown in FIG. 5c.

Figure 5D:
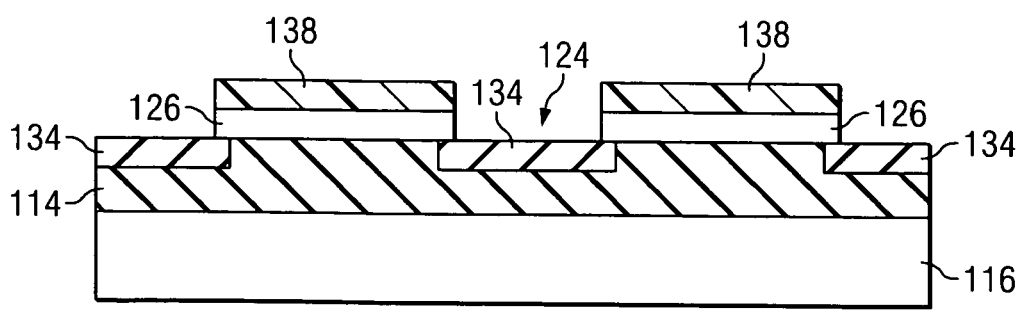

The bottom of the trench 124 is the exposed surface of buried oxide 114. At this point, regions of the buried oxide 114 immediately below the exposed buried oxide surface may be converted to recess-resistant regions 134, as shown in FIG. 5d. The conversion process may be a nitridation process, such as an exposure to a nitridizing ambient at an elevated temperature. The nitridizing ambient may be a gas ambient containing nitrogen species, e.g. ammonia, $NH_3$, $N_2O$, or others. The nitridation process forms a recess-resistant region 134 comprising of silicon oxynitride.

The conversion process may alternatively, or additionally, be an ion implantation of nitrogen or nitrogen-containing ions into the region to be converted into a recess-resistant region 134. According to this invention, the mask 138 protects the silicon islands 126 from receiving the implanted ions or from being exposed to the nitridizing ambient. An anneal at a selected temperature (e.g., between about 700 and about 1100 degrees Celsius) and a selected time (e.g., from about 1 to about 500 seconds) may additionally be performed. The ion implantation process forms a silicon oxynitride recess-resistant region.

The ion implantation process may implant nitrogen ions at an implant energy of about 100 electron-volts (eV) to about 10 kilo-electron-volts (keV) to achieve an implant depth of about 10 angstroms to about 350 angstroms. Such ion implantation conditions result in a silicon oxynitride region 134 that is close to the exposed surface of the buried oxide. In general, an ion implantation of nitrogen or nitrogen-containing ions at sufficiently low energy, e.g. less than 10 keV, results in a recess-resistant region that is near the surface of the buried oxide. The dose of the implant may be in the range of $10^{14}$ cm$^{-2}$ to $10^{16}$ cm$^{-2}$.

By implanting the nitrogen ions at a larger implant energy, e.g., about 10 keV to about 100 keV, implant depths of more than 350 angstroms will be achieved. This results in a buried silicon oxynitride or recess-resistant region that is beneath the surface of the buried oxide.

Figure 5E:
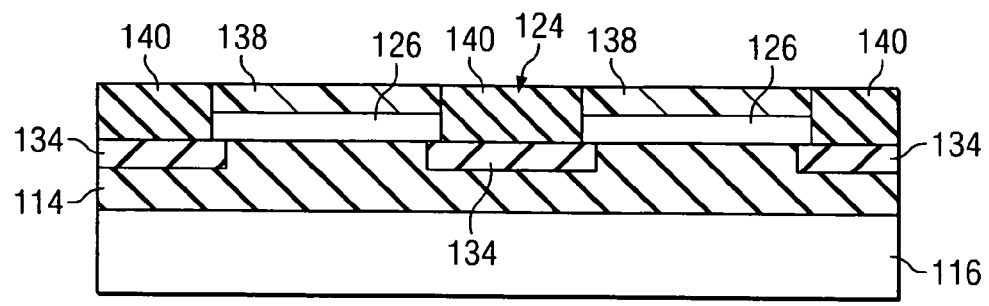
Figure 5F:
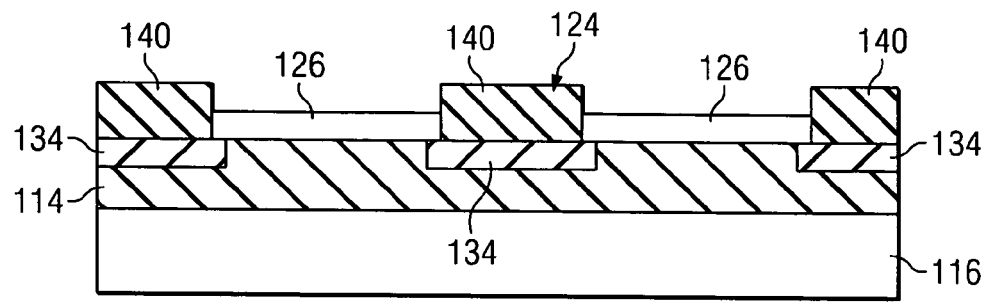

Referring next to FIG. 5e, trenches 124 are filled with a trench filling material 140, such as silicon oxide (e.g., $SiO_2$). The trench filling material 140 protects the recess-resistant material 134 while the mask 138 is removed. Since the mask 138 may be formed from a material similar to that of the recess-resistant region 134, the removal of the mask potentially removes the recess-resistant region. Therefore, as shown in FIG. 5f, the trench filling material 140 adequately protects the recess-resistant region 134 from being removed during mask removal.

Figure 5G:
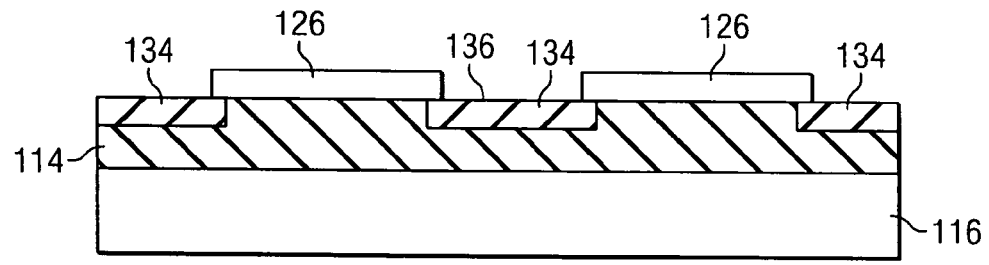

After the mask 138 is removed, the trench filling material 140 may be removed, as shown in FIG. 5g. At this point, the silicon islands or silicon mesas 126 are formed. The regions of the buried oxide 114 not covered by the silicon mesas 126 are protected from being etched by wet cleaning process agents which are typically used before the wafer enters a gate dielectric deposition or growth chamber. The wet cleaning solutions potentially etch into the buried oxide 114 and result in a recessed buried oxide if the recess-resistant layer does not protect it. The recess-resistant layer has a very low etch rate in commonly used wet cleaning solutions such as dilute hydrochloric acid, and minimizes the amount of recess in the exposed surface of the buried oxide.

Figure 5H:
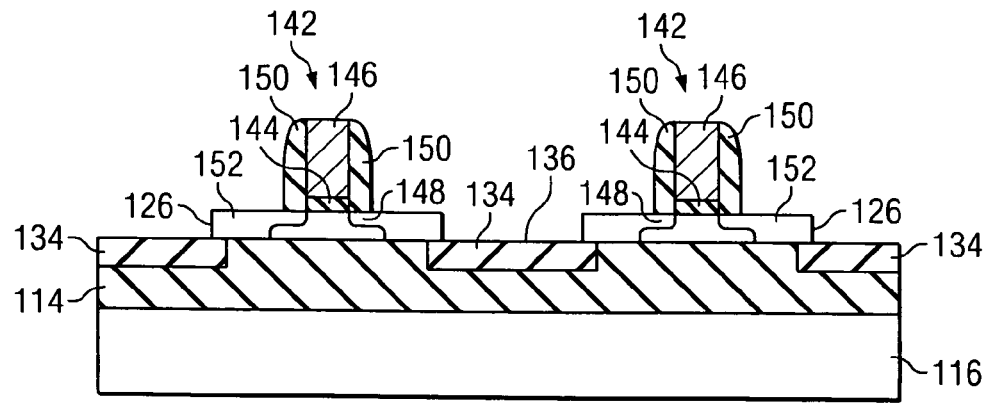

Next, active devices 142 are formed. FIG. 5h illustrates the formation of a transistor as the active device 142. A gate dielectric 144 may be formed by thermal oxidation, chemical vapor deposition, or sputtering. The gate dielectric may comprise of a conventional material such as silicon dioxide or silicon oxynitride with a thickness ranging from about 3 angstroms to about 100 angstroms, preferably about 10 angstroms or less. The gate dielectric may also comprise of high permittivity (high-k) materials such as lanthalum oxide (e.g., $La_2O_3$), aluminum oxide (e.g., $Al_2O_3$), hafnium oxide (e.g., $HfO_2$), hafnium oxynitride (e.g., HfON), or zirconium oxide (e.g., $ZrO_2$), with an equivalent oxide thickness of 3 angstroms to 100 angstroms.

After formation of the gate dielectric 144, the gate electrode material 146 is deposited. The gate material may be polycrystalline-silicon (poly-Si), polycrystalline silicon-germanium (poly-SiGe), a refractory metal such as molybdenum and tungsten, compounds such as titanium nitride, or other conducting materials. Compound layers of more than one of these materials, e.g., polycrystalline silicon and a refractory metal capable of forming a metal silicide, can be used. Examples include polycrystalline silicon with titanium silicide, tantalum silicide, cobalt silicide, or nickel silicide.

A gate mask (not shown) is defined and the underlying gate material is etched to form the gate electrode 146. The gate etch stops on the gate dielectric, and the gate is electrically isolated from the transistor structure by the gate dielectric. In the preferred embodiment, the gate material is poly-Si and the gate dielectric is silicon oxynitride. A plasma etch using chlorine and bromine chemistry may be used for the gate electrode etching. After gate definition, the gate mask can be removed.

The source and drain extensions 148 are formed next. This may be achieved by ion implantation, plasma immersion ion implantation (PIII), or other techniques known and used in the art. Next, a spacer 150 is formed on the sidewalls of the gate 146 by deposition and selective etching of the spacer material. The spacer material may comprise of a dielectric material such as silicon nitride or silicon dioxide. In the preferred embodiment, the spacer comprises of silicon nitride.

After spacer formation, source and drain regions 152 are doped by ion implantation, PIII, gas or solid source diffusion, or any other techniques known and used in the art. Any implant damage or amorphization can be annealed through subsequent exposure to elevated temperatures. The resistance of the source, drain, and gate can also be reduced by strapping the source, drain, and gate with a conductive material. The conductive material may be a metallic silicide such as titanium silicide, cobalt silicide, or nickel silicide. In the preferred embodiment, the conductive material is nickel silicide, which may be formed by a self-aligned silicide (salicide) process.

A second method embodiment will now be described. This embodiment can be best understood with reference to FIGS. 5c, 5d and 5g. As in the first embodiment, a starting substrate comprising of a semiconductor active layer 112 overlying a buried insulator layer 114 is provided. In FIG. 5b, a patterned mask 138 is used to define active regions 126 in the active layer 114. According to the second method embodiment, the patterned mask 138 is formed from a mask material with a different etch rate than nitrided oxide or silicon oxynitride. The mask material 138 is preferably photoresist. The mask material may also be a non-silicon material. The mask material may also be a material with less than 30% silicon by atomic concentration. The mask material may also be a stack of mask materials. In addition, the mask material may be a photoresist layer overlying an anti-reflective coating (ARC) layer.

The etching of the active layer 112 forms trenches 124 between silicon islands, as shown in FIG. 5c and the bottom of the trench 124 is converted to recess-resistant regions 134, as shown in FIG. 5d. As discussed above, the conversion process may be a nitridation process and/or an implantation process.

In this embodiment, the mask material 138 is a photoresist, which can be easily removed, for example, by exposure to an oxygen plasma in a process known as ashing, or by etching in an organic solvent. By selectively removing the mask material, the cross-section according to FIG. 5g can be achieved. In this embodiment, the trench filling material 140 is not necessary.

Active devices 142, such as transistors, can then be formed on the silicon islands 126, as shown in FIG. 5h. The formation of transistor devices was discussed above.

A third method embodiment is now described with respect to FIGS. 6a–d. The first few steps of the third method embodiment are identical to the first method embodiment. As a result, the discussion related to FIGS. 5a–5c will not be repeated here.

Figure 6A:
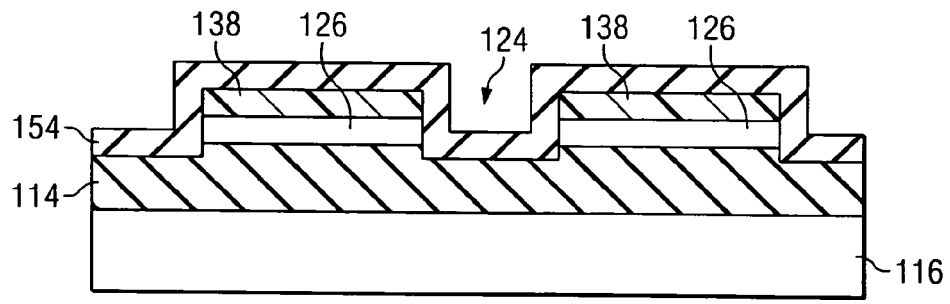
FIGS. 6a–6d show an alternative method for forming an SOI device of the present invention.

Referring to FIG. 5c and FIG. 6a, a slight recess in the buried oxide 114 may or may not be etched. In the preferred embodiment, the buried oxide 114 is slightly etched, by an amount in the range of about 10 angstroms to about 100 angstroms, or by an amount equal to the thickness of the recess-resistant layer 154 to be subsequently deposited. The mask 138 may or may not be removed at this point. A recess-resistant layer 154 is then deposited, e.g., by chemical vapor deposition, as shown in FIG. 6a. In FIG. 6a, the mask 138 is not removed prior to the deposition of the recess-resistant layer 154, but it is understood that it may be removed before the deposition of the recess-resistant layer 154. The recess-resistant layer 154 is substantially conformal, and is formed over the silicon island 126 and the buried oxide 114.

Figure 6B:
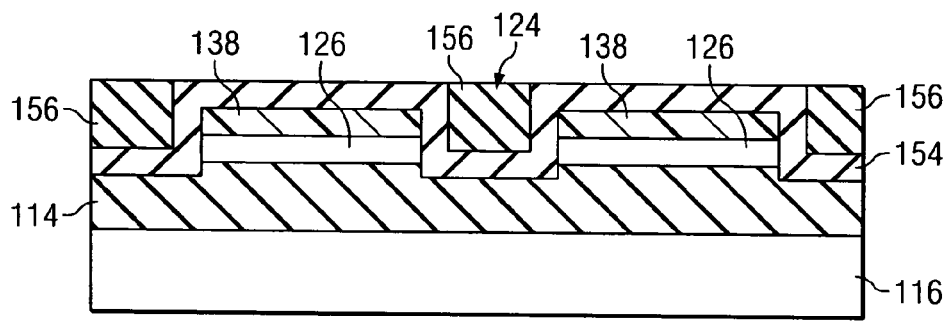

Referring now to FIG. 6b, the trenches 124 between the active regions 126 are filled with a dielectric 156, preferably silicon oxide (e.g., $SiO_2$). A chemical mechanical planarization process may be performed to obtain the cross-section as shown in FIG. 6b. The recess-resistant layer 154 above the silicon islands 126 may then be removed using an etch, preferably a wet etch. The mask 138 may be removed in the same process step. The etch may or may not remove the recess-resistant material 154 on the sidewalls of the silicon active regions 126.

Figure 6C:
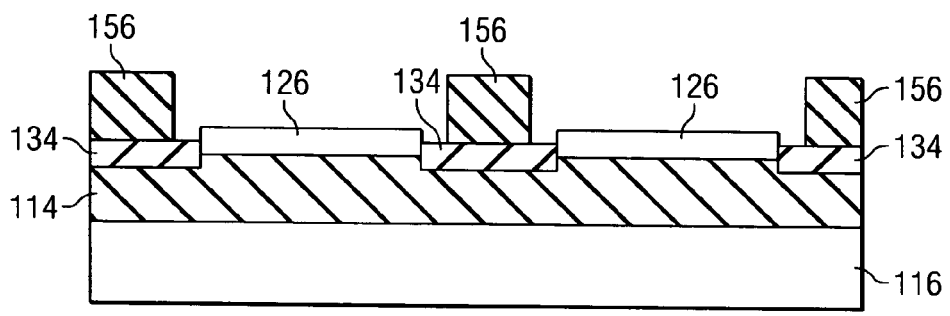
Figure 6D:
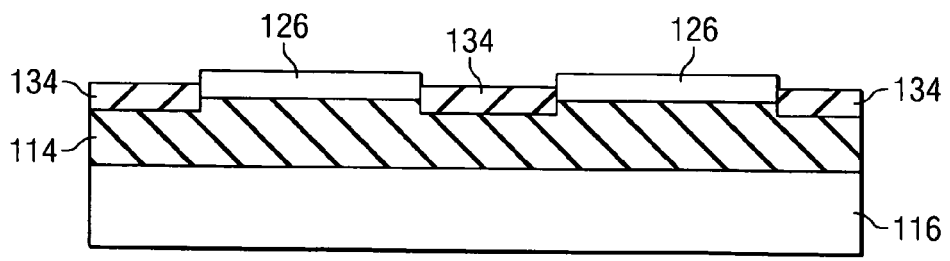

In the case where the recess-resistant layer on the sidewalls of the silicon active region is removed, the resulting structure is depicted in FIG. 6c. The dielectric filling the trench may then be removed, as illustrated in FIG. 6d. Although not shown, active devices (e.g., 142 from FIG. 5h) can be formed in the silicon islands 126 as discussed above.

While several embodiments of the invention, together with modifications thereof, have been described in detail herein and illustrated in the accompanying drawings, it will be evident that various modifications are possible without departing from the scope of the present invention. The examples given are intended to be illustrative rather than exclusive.

What is claimed is:

1. A semiconductor-on-insulator structure comprising:
   a substrate;
   a buried insulator layer overlying the substrate;
   a plurality of semiconductor islands overlying and abutting the buried insulator layer, the semiconductor islands being isolated from one another by trenches; and
   a plurality of recess resistant regions overlying the buried insulator layer at a lower surface of the trenches, wherein at least a portion of each semiconductor island does not overlie any recess resistant region.

2. The structure of claim 1 wherein the buried insulator layer comprises an oxide layer.

3. The structure of claim 1 wherein the recess resistant regions comprise oxynitride regions.

4. The structure of claim 1 wherein the recess resistant regions comprise nitride regions.

5. The structure of claim 1 wherein the semiconductor islands comprise silicon islands.

6. The structure of claim 5 wherein the semiconductor islands are formed from strained silicon.

7. The structure of claim 1 wherein the buried insulator layer has an upper surface and the recess resistant regions have an upper surface, wherein upper surface of the recess resistant regions is substantially planar to the upper surface of the buried insulator layer beneath the semiconductor islands.

8. The structure of claim 1 and further comprising a thin material layer overlying the recess resistant regions.

9. The structure of claim 8 wherein the thin material layer and the buried insulator layer are formed from the same material.

10. The structure of claim 1 wherein the recess resistant regions are formed from a dielectric characterized by an etch rate of less than 10 angstroms per minute in a wet cleaning solution.

11. The structure of claim 1 wherein the recess resistant regions are located above an outer surface of the buried insulator layer.

12. The structure of claim 1 wherein the recess resistant regions are located at a depth within the buried insulator layer.

13. The structure of claim 1 wherein the recess resistant regions have a thickness of between about 10 angstroms and about 200 angstroms.

14. The structure of claim 1 further comprising at least one transistor formed in the plurality of semiconductor islands.

15. A semiconductor device comprising:
a substrate;
a buried oxide layer disposed above the substrate, the buried oxide layer having a substantially planar upper surface;
a plurality of semiconductor islands overlying and abutting the buried oxide layer; and
a plurality of nitride regions disposed within the buried oxide layer in locations between the semiconductor islands, each of the nitride regions having an upper surface that is no higher than the upper surface of the buried oxide layer.

16. The device of claim 15 wherein the nitride regions comprise oxynitride regions.

17. The device of claim 15 wherein the upper surface of the nitride regions is substantially co-planar with the upper surface of the buried oxide layer.

18. The device of claim 15 and further comprising a thin oxide layer overlying each of the nitride regions.

19. A semiconductor device comprising:
a substrate;
a buried oxide layer disposed above the substrate, the buried oxide layer having a substantially planar upper surface;
a plurality of semiconductor islands overlying and physically touching the buried oxide layer; and
a plurality of nitride regions disposed within the buried oxide layer in locations between the semiconductor islands, each of the nitride regions having a lower surface that is below the upper surface of the buried oxide layer.

20. The device of claim 19 wherein each of the nitride regions has an upper surface that is no higher than the upper surface of the buried oxide layer.

* * * * *

UNITED STATES PATENT AND TRADEMARK OFFICE
CERTIFICATE OF CORRECTION

PATENT NO.      : 6,979,867 B2
DATED           : December 27, 2005
INVENTOR(S)     : Yeo et al.

It is certified that error appears in the above-identified patent and that said Letters Patent is hereby corrected as shown below:

Title page,
Item [73], Assignee, delete "Taiwan Semiconductor Manufacturing Ltd. Co."; and insert -- Taiwan Semiconductor Manufacturing Co., Ltd. --.

Signed and Sealed this

Seventh Day of March, 2006

JON W. DUDAS
*Director of the United States Patent and Trademark Office*